United States Patent [19]

Wilmsmeyer

[11] 3,916,219

[45] Oct. 28, 1975

[54] BUCKET BRIGADE CIRCUIT HAVING FREQUENCY DEPENDENT ATTENUATION COMPENSATION

[75] Inventor: Klaus Wilmsmeyer, Denzlingen, Germany

[73] Assignee: ITT Industries, Inc., New York, N.Y.

[22] Filed: Mar. 4, 1974

[21] Appl. No.: 447,608

[30] Foreign Application Priority Data

Apr. 6, 1973 Germany ............................ 2317253

[52] U.S. Cl. .......... 307/221 C; 307/221 D; 307/304; 307/293

[51] Int. Cl.$^2$ .................. G11C 19/00; H03K 21/00; H03K 23/08

[58] Field of Search ............ 307/221 C, 221 D, 246, 307/293, 304; 357/24

[56] References Cited

UNITED STATES PATENTS

| | | | |
|---|---|---|---|
| 3,546,490 | 12/1970 | Sangster | 307/293 |
| 3,666,972 | 5/1972 | Sangster | 307/221 C |
| 3,671,771 | 6/1972 | Sangster | 307/293 |
| 3,819,954 | 6/1974 | Butler et al. | 307/221 D |

*Primary Examiner*—Stanley D. Miller, Jr.
*Attorney, Agent, or Firm*—John T. O'Halloran; Menotti J. Lombardi, Jr.; Vincent Ingrassia

[57] ABSTRACT

A bucket brigade circuit or delay line has provided therein means to effect frequency dependent compensation of the signal attenuation after n-stages. The compensation circuit contains a clocked capacitive transferring circuit adding the frequency dependent signal loss to the bucket brigade line signal.

5 Claims, 1 Drawing Figure

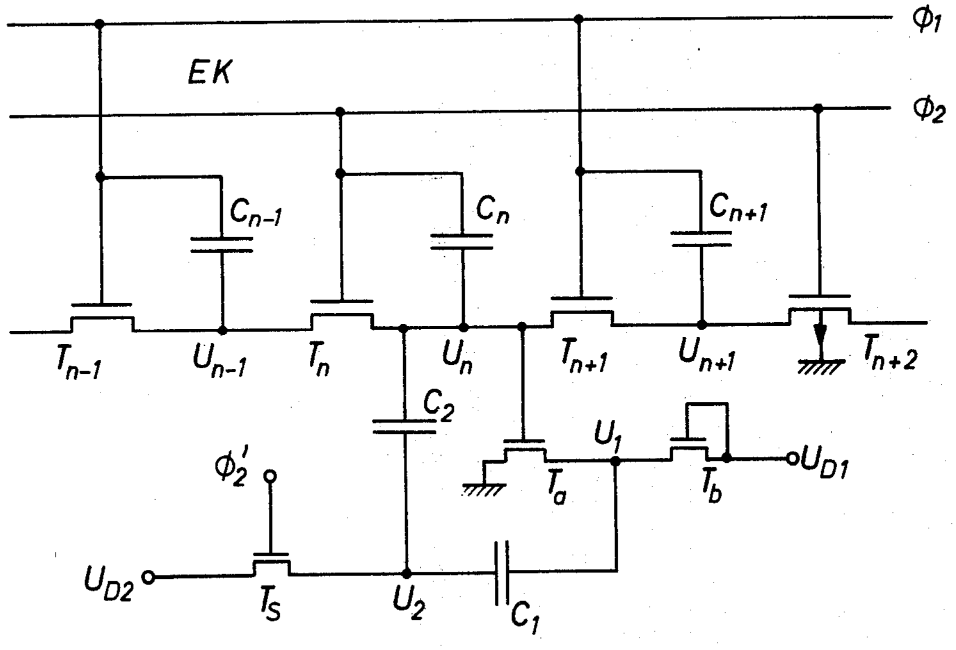
Φ1
EK
Φ2
Cn-1
Cn
Cn+1
Tn-1
Un-1
Tn
Un
Tn+1
Un+1
Tn+2
C2
U1
Φ2'
Ta
Tb
UD1
UD2
TS
U2
C1

BUCKET BRIGADE CIRCUIT HAVING FREQUENCY DEPENDENT ATTENUATION COMPENSATION

BACKGROUND OF THE INVENTION

This invention relates to improved bucket-brigade circuits having a frequency dependent attenuation compensation circuit. Known bucket-brigade circuits comprise a plurality of stages which are all of the same kind, and wherein each consists of a transistor and a capacitor arranged between the gate and the collector electrode thereof. The stages are connected in series such that the collector electrode of one is connected to the emitter electrode of the next following transistor. The gate electrodes of the even-numbered transistors are controlled by a first square-wave clock signal, and the gate electrodes of the odd-numbered transistors are controlled by a second square-wave and equal-frequency clock signal whose effective pulses fall within the intervals of the effective pulses of the first clock signal. In the relevant literature, such bucket-brigade circuits are also referred to as shift registers or delay lines for analog signals. A description of known bucket-brigade circuits can be found on pages 131 to 136 of the June 1969 "IEEE Journal of Solid-State Circuits."

The problem inherent in such bucket-brigade circuits has been desccribed, for example, in an article published on pages 941 to 950 in the "IEEE Transactions on Electron Devices" for October 1971, and on pages 391 to 394 of the "IEEE Journal of Solid-State Circuits" for December 1971, and resides in the fact that the attenuation of the signal to be delayed increases as the frequency increases, reaching the greatest attenuation at the maximum delayable signal frequency which, according to the sampling theorem, is equal to half the frequency of the clock signals. The reason for this is seen in that in the sampled signal the greatest jumps in potential occur at this particular frequency. The frequency-dependence of the attenuation restricts the maximum utilizable number of stages of the bucket-brigade circuits and, consequently, also the maximum obtainable delay time.

From the first of the aforementioned publications, so-called level regenerating circuits have already become known which, however, only vary the d.c. level and/or amplify the signal to be delayed without, however, preferentially raising the high-frequency end thereof.

SUMMARY OF THE INVENTION

It is an object of the present invention to provide a bucket-brigade circuit wherein the high-frequency end of the signal band to be delayed is raised i.e. in which there is effected a frequency-dependent compensation of the aforementioned attenuation by means of an additional circuit.

According to a broad aspect of the invention there is provided an improved bucket-brigade circuit of the type wherein there is provided a plurality of stages, each stage comprising a transistor and a capacitor coupled between the gate and drain electrodes of said transistor and wherein each stage is coupled in series such that the drain electrode of said transistor is coupled to the source electrode of the next successive transistor, and wherein the gate electrodes of odd-numbered transistors are coupled to a first clock signal and the gate electrodes of even-numbered transistors are coupled to a second clock signal having a frequency equal to that of said first clock signal and whose effective pulses occur during the intervals between the effective pulses of said first clock signal, wherein the improvement comprises an amplifier having an input and an output, said input coupled to the drain of a transistor in one of said stages, and said output capacitively coupled to the drain of the transistor in said one of said stages during the blocked state thereof.

BRIEF DESCRIPTION OF THE DRAWINGS

The above and other objects of the present invention will be more clearly understood from the following detailed description taken in conjunction with the accompanying drawing which is a schematic diagram of a bucket-brigade circuit having frequency dependent attentuation compensation.

DESCRIPTION OF PREFERRED EMBODIMENT

The upper half of the drawing shows some stages of a conventional bucket-brigade circuit EK consisting of insulated p-channel field-effect transistors (p-channel IGFETs) which, in some of the transistors, is denoted by the arrowhead on the substrate terminal connected to the zero point of the circuit. Of course, it is also possible to employ n-channel IGFETs as well as bipolar pnp- or npn-type transistors. It is possible to use IGFETs of the enhancement type as well as ones of the depletion type. The substrate terminal of the transistors may also be applied to a constant potential deviating from zero.

Of the entire bucket-brigade circuit which, as is well known, may comprise some hundred stages, with the number of stages being dependent upon the intended delay time as well as upon the maximum signal frequency to be transmitted, there are shown in the drawing transistors $T_{n-1}$, $T_n$, $T_{n+1}$ and $T_{n+2}$, interlinked and arranged in series with the associated capacitors C in the manner described hereinbefore. The odd-numbered transistors $T_{n-1}$ and $T_{n+1}$ are applied with their gate electrodes to the first clock signal $0_1$, and the even-numbered transistors $T_n$ and $T_{n+2}$ are applied with their gate electrodes to the second clock signal $0_2$.

Each clock signal is formed by a square-wave and equal-frequency voltage referred to the zero point of the circuit, with the amplitude of the one clock signal lying in the interval between the effective pulses of the other clock signal, and vice versa. The pulse duty factor may in this case amount to 0.5. Of course, it is also possible to choose a pulse-duty factor deviating from this pulse duty factor in such a way that intervals appear between the effective pulses of the two clock signals during which both clock signals are at zero.

As is well known, a bucket-brigade circuit of this type operates in such a way that every second stage, hence every odd-numbered or every even-numbered stage, at the end of a clock pulse, contains a signal information in the form of a quantity of charge stored in the associated capacitor C while no information is contained in the capacitors of the stages lying in between. The potentials at the corresponding junctions have all run up to the same value $U_{max} = U_C - U_T$, so that the discharge has come to a standstill via the respective transistor lying on the right. $U_T$ indicates the threshold voltage as appearing between the gate terminal and the source terminal of the respective transistor, and $U_C$ indicates the amplitude of the clock signal.

The basic principle underlying the present invention for effecting the frequency-dependent compensation of the signal attenuation now resides in that the signal charge representing the information is being taken up uninfluenced during the one clock phase from the preceding stage and is transferred during the other clock phase, to the following stage by way of a negative feedback and controlled by its own value.

In the embodiment shown in the drawing, this principle underlying the invention is realized in that to the collector (drain) terminal of the transistor $T_n$ there is connected the gate electrode of a transistor $T_a$ whose emitter (source) is connected to the zero point of the circuit, and whose collector (drain) is applied to the operating potential $U_{D1}$ across the transistor $T_b$ connected as a resistor. Accordingly, the transistor $T_a$ operates as an amplifier. The collector (drain) terminal of transistor $T_a$ is connected to the collector (drain) terminal of transistor $T_n$ via a series arrangement consisting of the first capacitor $C_1$ and of the capacitor $C_2$.

The common connecting point of the two capacitors $C_1$ and $C_2$ is applied via the controlled current path of the switching transistor $T_s$ to the constant potential $U_{D2}$, while the gate electrode thereof is applied to the auxiliary clock signal $0_2'$. The auxiliary clock signal $0_2'$ corresponds in its waveform to the second clock signal $0_2$, but controls the switching transistor $T_s$ in such a way that the latter is only blocked after the blocking of transistor $T_n$, but prior to the unblocking of the next successive transistor $T_{n+1}$. This may be accomplished by suitably dimensioning the switching transistor $T_s$.

The mode of operation of the compensation circuit is as described below. During the time in which the second clock signal with its amplitude $U_C$ is applied to the corresponding transistors, the bucket-brigade circuit operates as if it were without a compensation circuit. Merely the capacitance of capacitor $C_n$ is increased by the capacitance $C_2$ to $C_n+C_2$. During this time the switching transistor $T_s$ is rendered conductive and thus, owing to its low forward resistance, retains the potential $U_2$ at the connecting point of the two capacitors $C_1$ and $C_2$ at the constant potential $U_{D2}$. During this clock phase the signal charge $Q_1$ is transferred from the capacitor of the preceding stage to the enlarged capacitance $C_n+C_2$.

Shortly after the second clock signal drops back to zero, the potential $U_2$ is still retained by the switching transistor $T_s$. A short time thereafter, when the auxiliary clock signal likewise dropped back to zero, the switching transistor $T_s$ is blocked, and the potential $U_2$ is now controlled via the capacitor $C_1$ by the amplifier output. Via the capacitor $C_2$, any variations of the collector (drain) potential $U_n$ of transistor $T_n$, are now fed back to this potential level. The following leading edge of the first clock signal has no effect upon the potential $U_n$.

During the transfer of the signal charge as contained in the enlarged capacitance $C_n+C_2$, to the capacitor $C_{n+1}$ of the next following stage, the potential $U_n$ rises towards $U_C-U_T$. Considering that this rise by being inverted via the amplifier stage and the capacitors $C_1$ and $C_2$, is again transferred to the collector (drain) terminal of transistor $T_n$, the total capacitance of the stage, owing to this negative feedback, is greater than originally, namely $$C' = C + (1 + \alpha)\, C_1C_2/C_1+C_2 \qquad (1)$$

from which the following results with respect to the case where $C_1 >> C_2$:

$$C' = C + C_2 + \alpha C_2, \qquad (2)$$

wherein $\alpha$ indicates the gain factor of the amplifier, which is greater than zero.

Owing to the fact that the entire voltage variation at the discharge during this clock phase is determined by both the signal charge previously flown in at a lower capacitance and by the voltage caused thereby at the collector (drain) terminal of transistor $T_n$, as well as by the signal-independent potential $U_C-U_T$, the charge transferred to the next successive capacitor is now greater than the one that came from the preceding capacitor.

With respect to direct current, the bucket-brigade circuit is also terminated by the compensation circuit. Accordingly, the stage n will suffer from a shortage of charge whenever more charge flows off during the clock signal $0_1$ than flows in during the clock signal $0_2$. This shortage in charge is added to the next charge flowing in from the preceding capacitor, so that a new signal is formed at the collector (drain) terminal of transistor $T_n$, containing a portion of the preceding shortage in charge.

Considering that the actual cause of the frequency-dependent signal attenuation of the bucket-brigade circuit is seen in that the next successive signal, during each charge reversal, takes over a certain quantity of charge from the preceding one, and which is in proportion to the difference between the two signal values, and so directed that the next successive one attempts to approach the preceding one, it is possible to state an optimum dimensioning rule of the aforementioned equation (2), i.e. it is possible to state combinations of $\alpha$, $C_2$ and C with the aid of which, via the aforementioned shortage in charge, the signal compensation can just be eliminated again.

Relative thereto, consideration is given to the most unfavorable case, namely to the case where the signal to be delayed is a signal passing through the bucket-brigade circuit at half the clock frequency $f_c/2$, which means to imply that alternating signal values pass through the line. After $n$ stages, the attenuation of this $f_c/2$ signal amounts to $d_{max}$, and is to be compensated by the additional circuit, i.e. signal charges of the original amount shall again be available in the capacitor $C_{n+1}$ of the next successive stage. It can be proved that with respect to this case, the following requirement must be met:

$$\alpha\, C_2/C_n+C_2 = d_{max}/2-d_{max}\,. \qquad (3)$$

Therefore, in order to obtain an optimum compensation of the signal attenuation, the amplifier will have to be dimensioned in such a way that the gain factor $\alpha$ will satisfy equation (3). This may be accomplished, for example, either by setting the operating point accordingly, or by adjusting the resistance value of transistor $T_b$ which is operated as a load resistance, by means of a corresponding voltage variation at the gate electrode thereof.

The once dimensioned optimum compensation of the signal attenuation, of course, only applies to the firmly given clock frequency $f_c$, but at a variable clock frequency the gain factor $\alpha$ can be varied accordingly as is disclosed, for example, in U.S. application, Ser. No. 458,153, filed Apr. 5, 1974.

The invention, however, can also be advantageously applied without this follow-up of the gain factor in the case of low clock frequencies, hence e.g. for delaying acoustical signals, because also in the case of low clock frequencies the maximum attenuation $d_{max}$ is only very slightly dependent upon the clock frequency $f_c$.

Considering that a stationary and stable condition will result in cases where the bucket-brigade circuit is controlled by a d.c. voltage signal, with the output signal being equal to the input signal, there will be obtained a total attenuation of the bucket-brigade circuit which will equal zero with respect to the signal frequency zero as well as the signal frequency $f_c/2$. Between these two extreme values of the processable signal frequencies there is likely to appear a slight gain or attenuation which, however, is the smaller the more often the $f_c/2$-attenuation is compensated by the inventive additional circuit, in other words, the smaller the spacing is between two compensating circuits with the line of the bucket-brigade circuit.

It is to be understood that the foregoing description of specific examples of this invention is made by way of example only and is not to be considered as a limitation on its scope.

What is claimed is:

1. An improved bucket-brigade circuit of the type wherein there is provided a plurality of stages, each stage comprising a transistor and a capacitor coupled between the gate and drain electrodes of said transistor and wherein each stage is coupled in series such that the drain electrode of said transistor is coupled to the source electrode of the next successive transitor, and wherein the gate electrodes of odd-numbered transistors are coupled to a first clock signal and the gate electrodes of even-numbered transistors are coupled to a second clock signal having a frequency equal to that of said first clock signal and whose effective pulses occur during the intervals between the effective pulses of said first clock signal, wherein the improvement comprises:

an amplifier for providing frequency dependent compensation of the signal attenuation, said amplifier comprising:

a first source of voltage;

a first transistor having a source electrode coupled to ground, a drain coupled to said first source and a gate electrode coupled to the drain electrode of a transistor in one of said stages;

a first capacitor coupled to the drain electrode of said first transistor;

a second capacitor coupled in series with said first capacitor and coupled to the drain electrode of the transistor in said one of said stages;

a second source of voltage;

a source of an auxiliary clock signal; and a switching transistor having a source coupled to said second source of voltage, a drain coupled to the junction of said first and second capacitors and a gate electrode coupled to said auxiliary clock signal for blocking said switching transistor when the transistor in said one of said stages is not blocked.

2. An improved bucket-brigade circuit according to claim 1 wherein the gain factor of the amplifier is regulated to obtain optimum attenuation compensation.

3. An improved bucket-brigade circuit according to claim 1 wherein all transistors are of the same conductivity type.

4. An improved bucket-brigade circuit according to claim 3 wherein said transistors are integrated insulated-gate field-effect transistors of the enhancement type.

5. An improved bucket-grigade circuit according to claim 3 wherein said transistors are integrated insulated-gate field-effect transistors of the depletion type.

* * * * *